US011653553B2

(12) United States Patent
Takata

(10) Patent No.: US 11,653,553 B2
(45) Date of Patent: May 16, 2023

(54) FUNCTIONAL LAYER FORMING INK AND SELF-LUMINOUS ELEMENT MANUFACTURING METHOD

(71) Applicant: JOLED INC., Tokyo (JP)

(72) Inventor: Masakazu Takata, Tokyo (JP)

(73) Assignee: JOLED INC., Tokyo (JP)

( * ) Notice: Subject to any disclaimer, the term of this patent is extended or adjusted under 35 U.S.C. 154(b) by 112 days.

(21) Appl. No.: 17/092,456

(22) Filed: Nov. 9, 2020

(65) Prior Publication Data

US 2021/0143330 A1   May 13, 2021

(30) Foreign Application Priority Data

Nov. 11, 2019   (JP) .............................. JP2019-203968

(51) Int. Cl.
| | | |
|---|---|---|
| H01L 51/00 | (2006.01) | |
| H01L 51/56 | (2006.01) | |
| H01L 27/32 | (2006.01) | |
| C09D 11/107 | (2014.01) | |
| C09D 11/36 | (2014.01) | |
| C09D 11/033 | (2014.01) | |
| H01L 51/50 | (2006.01) | |

(52) U.S. Cl.
CPC ........ *H01L 51/0007* (2013.01); *C09D 11/033* (2013.01); *C09D 11/107* (2013.01); *C09D 11/36* (2013.01); *H01L 27/3246* (2013.01); *H01L 51/004* (2013.01); *H01L 51/56* (2013.01); *H01L 27/3211* (2013.01); *H01L 51/0004* (2013.01); *H01L 51/5012* (2013.01)

(58) Field of Classification Search
CPC ............. H01L 51/0007; H01L 51/0004; H01L 51/5012; H01L 51/5056; H01L 51/5072
See application file for complete search history.

(56) References Cited

U.S. PATENT DOCUMENTS

| | | | |
|---|---|---|---|
| 2009/0267498 A1 | 10/2009 | Kawakami et al. | |
| 2010/0117028 A1* | 5/2010 | Takeshima | C09B 23/0066 252/301.16 |
| 2017/0073528 A1 | 3/2017 | Funahashi et al. | |
| 2019/0375956 A1* | 12/2019 | Pan | H01L 51/0058 |
| 2020/0259093 A1* | 8/2020 | Kim | H01L 51/0043 |

FOREIGN PATENT DOCUMENTS

| | | |
|---|---|---|
| JP | 2009-267299 A | 11/2009 |
| JP | 2014-210778 A | 11/2014 |
| JP | 2015-176694 A | 10/2015 |
| WO | 2008/105472 A1 | 9/2008 |

* cited by examiner

*Primary Examiner* — Fernando L Toledo
*Assistant Examiner* — Valerie N Newton
(74) *Attorney, Agent, or Firm* — Xsensus LLP

(57) ABSTRACT

A functional layer forming ink used in forming a functional layer of the self-luminous element by a printing method, the ink including functional material dissolved or dispersed in a mixed solvent including solvents having different boiling points. When one or more solvents are selected from the solvents of the mixed solvent in descending order of boiling point until a mass ratio of the selection to the mixed solvent is a defined ratio or more, the one or more solvents in the selection are included in a solvent group of solvents that have a contact angle of 5° or less with respect to a defined resin material.

12 Claims, 12 Drawing Sheets

FUNCTIONAL LAYER FORMING INK AND SELF-LUMINOUS ELEMENT MANUFACTURING METHOD

CROSS-REFERENCE TO RELATED APPLICATIONS

This application claims priority to Japanese Patent Application No. 2019-203968, filed Nov. 11, 2019, the contents of which are hereby incorporated by reference in their entirety.

BACKGROUND

Technical Field

The present disclosure relates to functional layer forming inks for use in manufacturing functional layers of self-luminous elements by a wet process and methods of manufacturing self-luminous elements using such functional layer forming inks.

Description of Related Art

In recent years, self-luminous panels using light-emitting elements such as organic electroluminescence (EL) elements and quantum-dot light-emitting diodes (QLED) have been actively developed. Self-luminous elements include pixel electrodes (first electrodes) in one-to-one correspondence with pixels, functional layers including a light-emitting layer, and a counter electrode (second electrode) common to a plurality of self-luminous elements, arranged in this order above a substrate. A light-emitting material in the light-emitting layer emits light when holes and electrons supplied from the pixel electrodes and the counter electrode recombine in the light-emitting layer.

Examples of methods of manufacturing functional layers in self-luminous panels include vapor deposition methods and application methods (for example, JP-A 2009-267299, WO 08/105472, JP-A 2015-176694, and JP-A 2014-210778). In an application method, a functional material is dissolved in a solvent to a form a solution (also referred to as an "ink"), and the ink is applied onto a substrate by a printing method (droplet ejection method) or the like. After application, the solvent is evaporated from the ink, which dries to form a functional layer. Accordingly, the application method does not need to be carried out in a vacuum chamber, which is beneficial for mass production.

Some application methods are pixel bank methods in which an application area is one pixel, and some application methods are line bank methods in which an application area includes multiple pixels. A line bank method can improve uniformity in film thickness of a functional layer across the multiple pixels in the application area, and is therefore useful in suppressing uneven light emission caused by differences in film thicknesses of functional layers between pixels.

SUMMARY

The present disclosure describes a functional layer forming ink and a method of manufacturing a self-luminous element using the functional layer forming ink that, when a functional layer is formed by an application method, (i) suppress uneven distribution of ink due to interruption of ink on a pixel regulation layer during ink drying, and (ii) improve uniformity of film thickness of the functional layer.

According to at least one embodiment, the functional layer forming ink is used in forming the functional layer of the self-luminous element by a printing method, the ink including functional material dissolved or dispersed in a mixed solvent including solvents having different boiling points. When one or more solvents are selected from the solvents of the mixed solvent in descending order of boiling point until a mass ratio of the selection to the mixed solvent is a defined ratio or more, the one or more solvents in the selection are included in a solvent group of solvents that have a contact angle of 5° or less with respect to a defined resin material.

Further, the method of manufacturing the self-luminous element according to at least one embodiment includes preparing a substrate, disposing pixel electrodes in a matrix of rows and columns above the substrate, forming pixel restriction layers that partition the pixel electrodes in a column direction, forming banks that partition the pixel electrodes in a row direction, forming functional layers above the pixel electrodes, and forming a counter electrode above the functional layers. The forming of the functional layers includes application of the functional layer forming ink onto the pixel electrodes in gaps between the banks and drying the functional layer forming ink after application. The functional layer forming ink includes functional material dissolved or dispersed in a mixed solvent including solvents having different boiling points, and when one or more solvents are selected from the solvents of the mixed solvent in descending order of boiling point until a mass ratio of the selection to the mixed solvent is a defined ratio or more, the one or more solvents in the selection are included in a solvent group of solvents that have a contact angle of 5° or less with respect to a defined resin material.

The functional layer forming ink according to at least one embodiment of the present disclosure has a contact angle with respect to a defined resin of less than 5° in a state of evaporation where a mass of the ink has become a defined fraction of the mass of the ink after application. Thus, when the defined resin is used as the pixel regulation layer, interruption of the ink on the pixel regulation layer can be suppressed, improving fluidity of the ink between sub-pixels, thereby increasing uniformity of film thickness of the functional layer between the sub-pixels.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIG. 9A illustrates a TFT layer formed on a base, FIG. 9B illustrates an interlayer insulating layer formed on the TFT layer, FIG. 9C illustrates a pixel electrode material layer formed on the interlayer insulating layer, and FIG. 9D illustrates the pixel electrode material layer patterned to form pixel electrodes.

FIG. 10A illustrates a pixel regulation material layer formed on the pixel electrodes and the interlayer insulating layer, FIG. 10B illustrates a state in which a pixel regulation layer is formed, FIG. 10C illustrates a bank material layer formed on the pixel electrodes and the interlayer insulating layer, and FIG. 10D illustrates a state in which banks are formed.

FIG. 11A illustrates hole injection layer material ink applied into openings of the banks to form hole injection layers and hole transport layer material ink applied into the openings of the banks to form hole transport layers, and FIG. 11B illustrates light-emitting layer material ink applied into the openings of the banks to form light-emitting layers.

FIG. 12A illustrates an electron transport layer formed on the banks and the light-emitting layers, FIG. 12B illustrates an electron injection layer formed on the electron transport layer, FIG. 12C illustrates a counter electrode formed on the electron injection layer, and FIG. 12D illustrates a sealing layer formed on the counter electrode.

DETAILED DESCRIPTION

Figure 1:
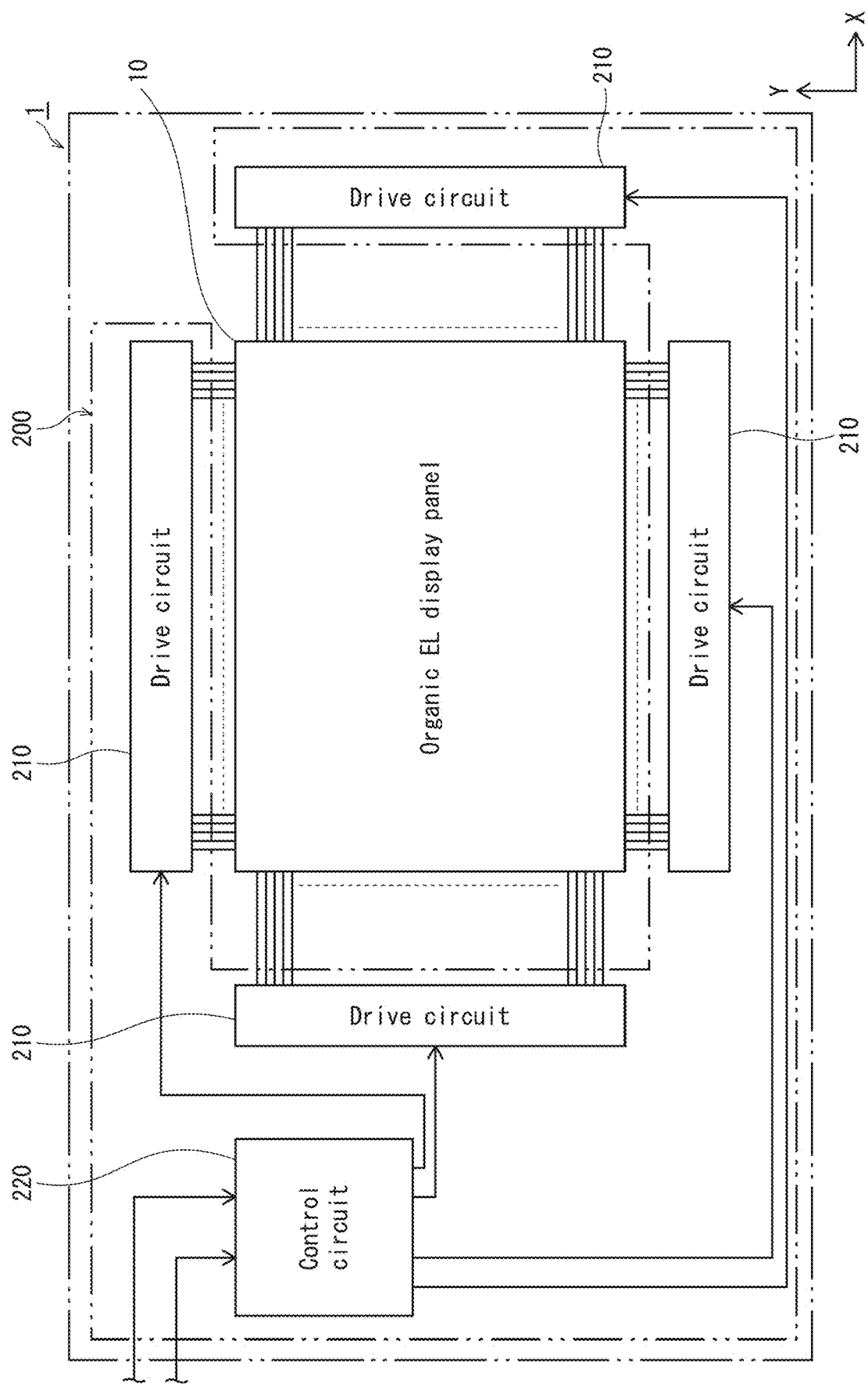
FIG. 1 is a schematic diagram of a display device 1 including a self-luminous panel 10 according to at least one embodiment.

As a film-forming process to form functional layers of self-luminous elements in a self-luminous panel, application film-forming using a printing device or the like is superior to vacuum deposition or the like in terms of manufacturing cost.

In application film-forming, in order to control functional layer film thickness and prevent color mixing, liquid-repellant banks separate application areas, which are areas in which ink can spread after application. Typical bank designs include pixel bank schemes in which the application areas are defined by grid-like banks and correspond one-to-one with sub-pixels, and line bank schemes in which the application areas are defined by banks that extend in one direction and correspond one-to-one with gaps between the banks. Line bank schemes make it easy to optimize ink droplet amounts per sub-pixel due to the application areas spanning multiple sub-pixels, and film thicknesses of functional layers are made uniform between the multiple sub-pixels due to ink after application spreading across the application area. Line bank schemes are therefore suitable as bank designs.

On the other hand, according to line bank schemes, functional layers in the same application area are films common to multiple self-luminous elements. Thus, in order to suppress current leakage between two adjacent self-luminous elements in the same application area, pixel electrodes are partitioned by a pixel regulation layer, which is an insulator. That is, according to a line bank scheme, the pixel regulation layers are also included in the application areas, and therefore when functional layer forming ink is applied, the ink is applied assuming that layers of the same material as the functional layers are also formed on the pixel regulation layers.

However, the inventors have found that uniformity of film thickness may be lost due to uneven distribution of ink on the pixel electrodes, depending on wettability of the functional layer forming ink with respect to the pixel regulation layers. In view of this technical problem, the inventors arrived at an aspect of the present disclosure as a result of extensive research to obtain a functional layer forming ink that does not separate into islands on the pixel regulation layers during drying of the ink.

According to at least one embodiment, the functional layer forming ink is used in forming the functional layer of the self-luminous element by a printing method, the ink including functional material dissolved or dispersed in a mixed solvent including solvents having different boiling points. When one or more solvents are selected from the solvents of the mixed solvent in descending order of boiling point until a mass ratio of the selection to the mixed solvent is a defined ratio or more, the one or more solvents in the selection are included in a solvent group of solvents that have a contact angle of 5° or less with respect to a defined resin material.

Further, the method of manufacturing the self-luminous element according to at least one embodiment includes preparing a substrate, disposing pixel electrodes in a matrix of rows and columns above the substrate, forming pixel restriction layers that partition the pixel electrodes in a column direction, forming banks that partition the pixel electrodes in a row direction, forming functional layers above the pixel electrodes, and forming a counter electrode above the functional layers. The forming of the functional layers includes application of the functional layer forming ink onto the pixel electrodes in gaps between the banks and drying the functional layer forming ink after application. The functional layer forming ink includes functional material dissolved or dispersed in a mixed solvent including solvents having different boiling points, and when one or more solvents are selected from the solvents of the mixed solvent in descending order of boiling point until a mass ratio of the selection to the mixed solvent is a defined ratio or more, the one or more solvents in the selection are included in a solvent group of solvents that have a contact angle of 5° or less with respect to a defined resin material.

The functional layer forming ink and the self-luminous element manufacturing method according to at least one embodiment of the present disclosure each result in a contact angle with respect to a defined resin of less than 5° in a state of evaporation where a mass of the ink has become a defined fraction of the mass of the ink after application. Thus, when the defined resin is used as the pixel regulation layer, interruption of the ink on the pixel regulation layer can be suppressed, improving fluidity of the ink between sub-pixels, thereby increasing uniformity of film thickness of the functional layer between the sub-pixels.

According to at least one embodiment, the defined resin material is acrylic resin.

Thus, when the acrylic resin is used as the pixel regulation layer, interruption of the ink on the pixel regulation layer can be suppressed, improving fluidity of the ink between sub-pixels, thereby increasing uniformity of film thickness of the functional layer between the sub-pixels.

According to at least one embodiment, the solvents in the solvent group are polar solvents.

Thus, when the acrylic resin is used as the pixel regulation layer, a polar solvent having a high affinity for acrylic resin remains when the ink is dried, and therefore interruption of the ink on the pixel regulation layer can be suppressed.

According to at least one embodiment, the solvents in the solvent group each satisfy $x+0.04y<2.13$ where x is $\delta D/(\delta D+\delta P+\delta H)$, y is surface tension of the solvent in mN/m, and $\delta D$ is energy due to London dispersion force, $\delta P$ is energy due to dipole interaction, and $\delta H$ is energy due to hydrogen bonding, as defined by the Hansen solubility parameter.

Thus, when the acrylic resin is used as the pixel regulation layer, a situation where solvent that causes interruption of the ink on the pixel regulation layer remains in the solution can be prevented.

According to at least one embodiment, the defined ratio is 0.3 or greater.

Thus, an excessive amount of solvent relative to solute in the ink can be prevented, and problems such as ink overflowing banks to cause color mixing can be prevented.

According to at least one embodiment, $q \geq 0.00086p+0.27512$ where p is resolution in ppi of the self-luminous element in a display and q is the defined ratio.

As a result, an ink appropriate for the resolution of the self-luminous element to be formed can be used.

According to at least one embodiment, the mixed solvent includes solvents that have a boiling point of 200° C. or more.

As a result, poor film formation due to ink having an excessively fast drying property can be prevented.

<Composition of Functional Layer Forming Ink>

1. Solute

A functional layer forming ink according to at least one embodiment of the present disclosure includes, as a solute, any one material selected from a group including a functional material having at least one of a hole transporting property and a hole injecting property, a light-emitting material, and a functional material having at least one of an electron transporting property and an electron injecting property.

2. Solvent

The functional layer forming ink according to at least one embodiment of the present disclosure includes multiple organic solvents as a mixed solvent.

The solvents that make up the mixed solvent include at least one solvent selected from a solvent group A of solvents that each have a contact angle of less than 5° with respect to the pixel regulation layers in the self-luminous panel. Further, when the mixed solvent includes a solvent selected from a solvent group B of solvents that each have a contact angle or 5° or more with respect to the pixel regulation layers in the self-luminous panel, then when the solvents in the mixed solvent are selected in descending order of boiling point so that a mass ratio of the selection to the mixed solvent is equal to or more than a defined ratio, all selected solvents are included in group A. Here, the defined ratio is a value determined by the resolution of the self-luminous panel and is, for example, 40% when the resolution is 150 ppi. Further details on this are described later.

<Application Areas in Self-Luminous Panel>

Prior to an explanation of an effect of the functional layer forming ink according to at least one embodiment, the following is an outline of the self-luminous panel and description of a mechanism by which the problem of uneven film thickness occurs when forming the functional layer by drying the functional layer forming ink.

FIG. 1 is a block diagram illustrating circuitry of a display device 1 that includes an organic EL display panel 10 as the self-luminous panel. As illustrated in FIG. 1, the display device 1 includes the organic EL display panel 10 and drive control circuitry 200 connected to the organic EL display panel 10. The drive control circuitry 200 includes a plurality of drive circuits 210 and a control circuit 220.

Figure 2:
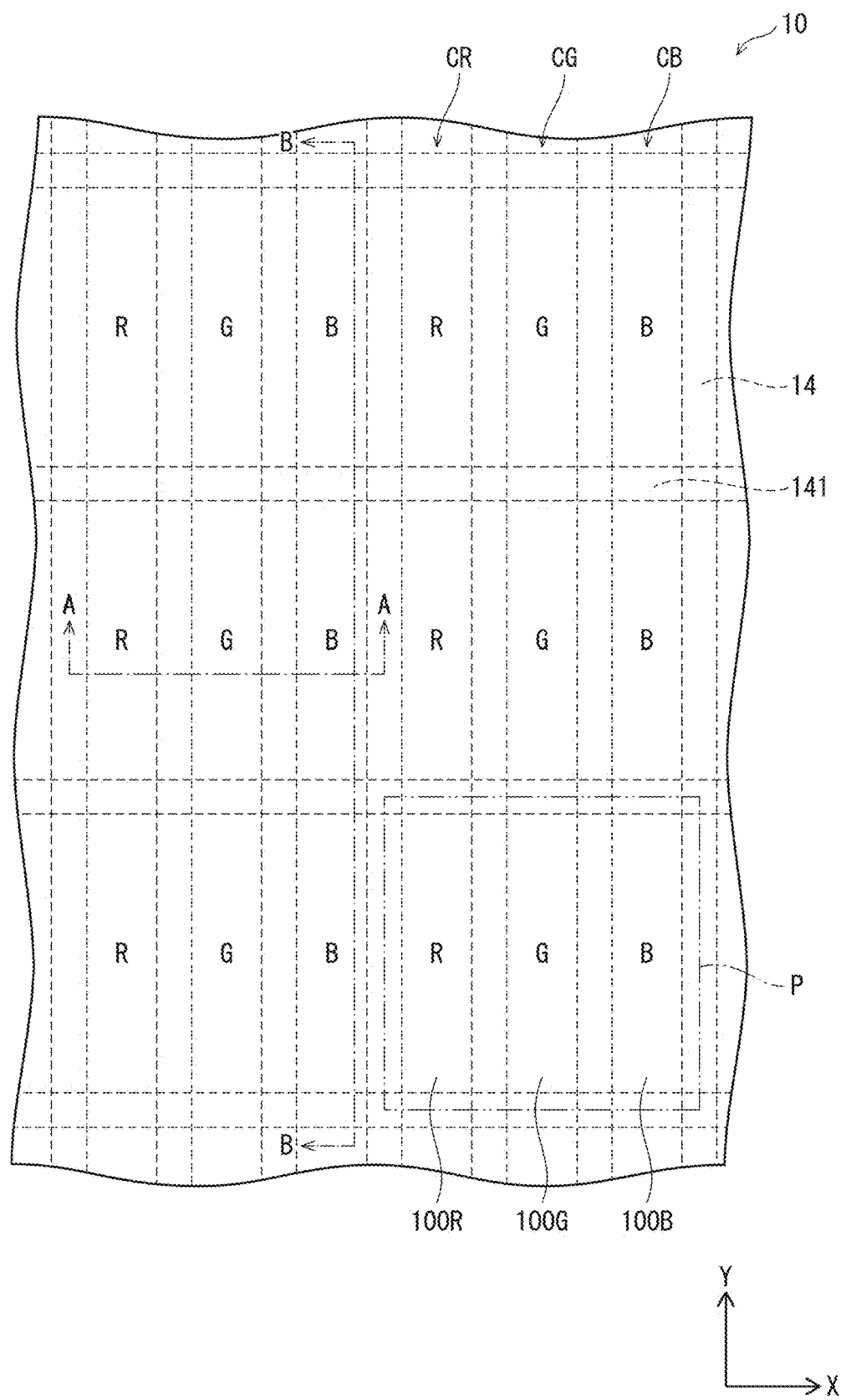
FIG. 2 is a schematic plan view diagram of the self-luminous panel 10 according to at least one embodiment.

FIG. 2 is a schematic plan view diagram of a portion of the organic EL display panel 10. The organic EL display panel 10 includes banks (column banks) 14 that partition the substrate in a row direction (X direction) to define application areas and pixel regulation layers (row banks) 141 that partition the substrate in a column direction (Y direction), which together partition a matrix of sub-pixels. Areas portioned by the banks 14 and the pixel regulation layers 141 constitute sub-pixels 100R, 100G, 100B, and the sub-pixels 100R, 100G, 100B constitute pixels P. The sub-pixels 100R, 100G, 100B are formed in application areas CR, CG, CB, each of which is defined by two of the banks 14 that are adjacent in the X direction.

Figure 3:
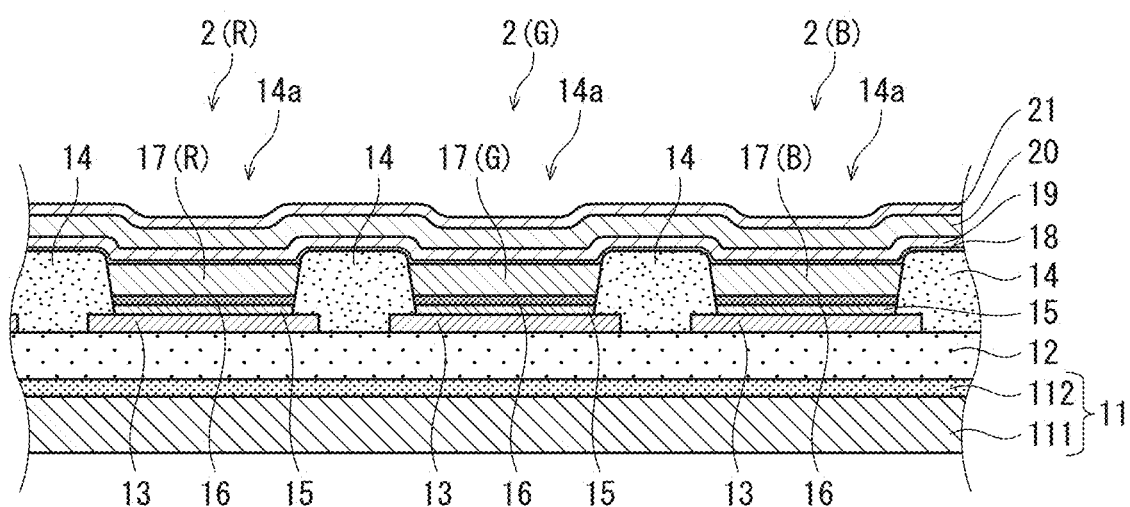
FIG. 3 is a cross-section diagram of the self-luminous panel 10 according to at least one embodiment, corresponding to a line A-A in FIG. 2.
Figure 3:
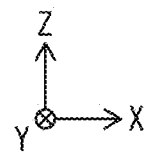

FIG. 3 is a schematic cross-section diagram of the organic EL display panel 10, along a line A-A in FIG. 2. The organic EL display panel includes, in the following order from bottom up, a substrate 11 composed of a base 111 and a TFT layer 112, an interlayer insulating layer 12, and banks 14, and in openings 14a includes pixel electrodes 13, hole injection layers 15, hole transport layers 16, and light-emitting layers 17, and as common layers includes an electron transport layer 18, an electron injection layer 19, a counter electrode 20, and a sealing layer 21. Among these, a portion from each of the pixel electrodes 13 to the counter electrode 20 constitutes an organic EL element 2. Further, at least one of the hole injection layers 15, the hole transport layers 16, and the light-emitting layers 17 is formed by an application method using a functional layer forming ink.

Figure 4A:
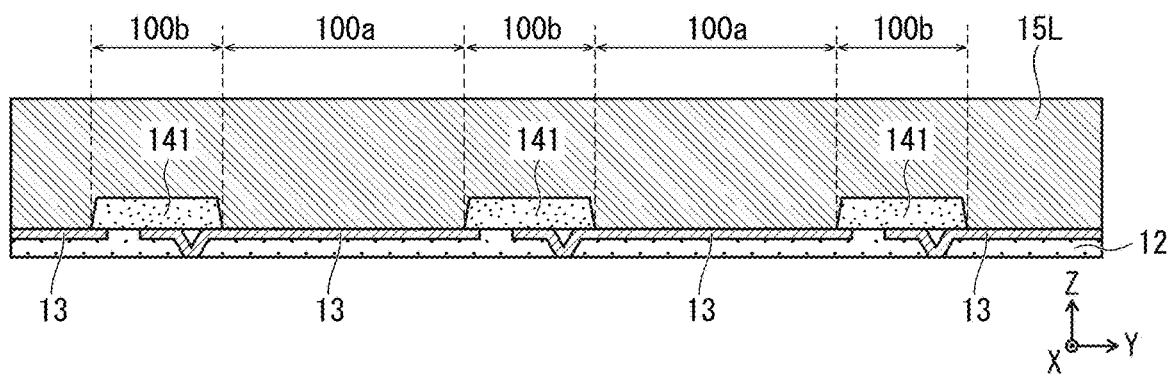
FIG. 4A, 4B, 4C, 4D, 4E are cross-section diagrams illustrating steps in manufacturing and post-manufacture of the self-luminous panel 10 according to at least one embodiment and according to a reference example, corresponding to a line B-B in FIG. 2.
Figure 4B:
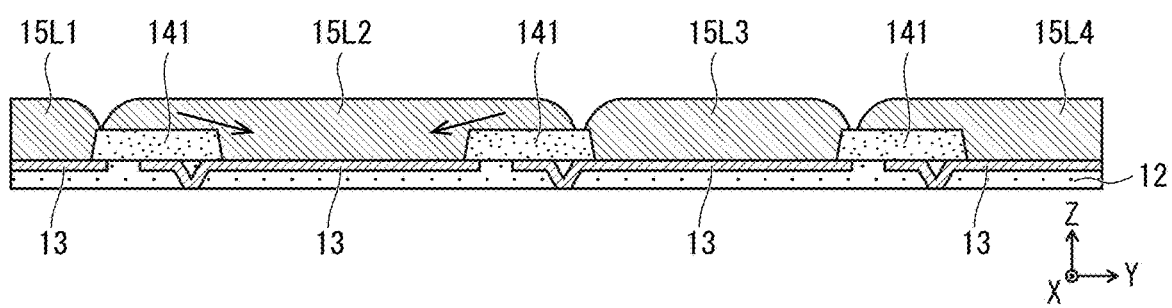
Figure 4C:
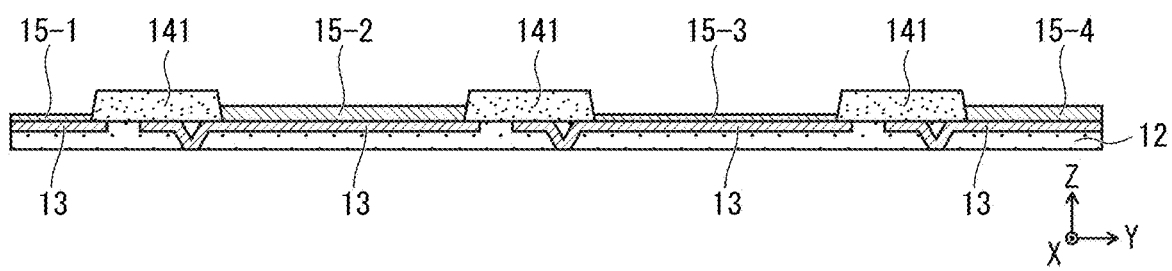

FIG. 4A, 4B, 4C, 4D, 4E are schematic cross-section diagrams illustrating a process from immediately after ink application to completion of a functional layer when the functional layer is the hole injection layers 15 formed by an application method. The cross-sections correspond to a line B-B in FIG. 2. FIG. 4A illustrates a state immediately after ink application, where an ink 15L is applied across light-emission areas 100a on the pixel electrodes 13 in the openings 14a and non-light-emission areas 100b on the pixel regulation layers 141. When wettability of the ink with respect to the pixel regulation layers 141 is low, as illustrated in FIG. 4B, the ink 15L separates into ink islands 15L1, 15L2, 15L3 on the pixel regulation layers 141. Boundaries between the ink islands 15L1, 15L2 and between the ink islands 15L2, 15L3 are not always evenly spaced, and therefore volumes of ink per light-emission area 100a are not always uniform. Further, when wettability of ink with respect to the pixel restriction layers 141 is low, then when ink dries further, ink flows from above the pixel regulations layer 141 to above the pixel electrodes 13. That is, in the light-emission areas 100a, only where ink in the light-emission areas 100a is continuous with ink in the non-light-emission areas 100b does ink flow from the non-light-emission areas 100b to the light-emission areas 100a. Accordingly, in such a light-emission area 100a, as illustrated by functional layer 15-2 in FIG. 4C, film thickness becomes thicker than other light-emission areas 100a. On the other hand, where ink the light-emission areas 100a is not continuous with ink in the non-light-emission areas 100b, only ink in the light-emission areas 100a contributes to forming the functional layers, and as illustrated by functional layer 15-3 in FIG. 4C, film thickness becomes thinner. Accordingly, uniformity of film thickness is lost.

Figure 5A:
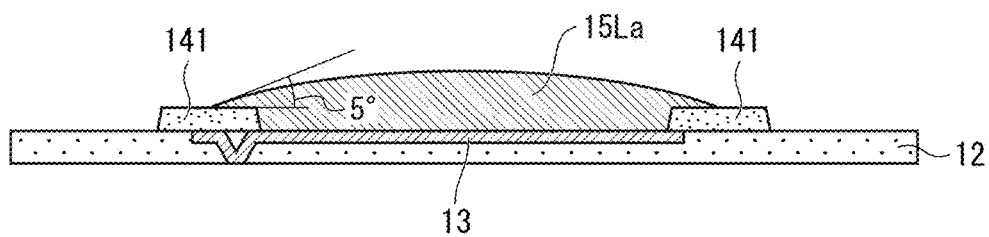
FIG. 5A, 5B, 5C are cross-section diagrams of the self-luminous panel 10 according to at least one embodiment, corresponding to the line B-B in FIG. 2.

When various solvents were used to test conditions for interruption of functional layer forming ink on the pixel restriction layers 141, then as illustrated in FIG. 5A, it was found that at an ink amount that can form a contact angle of 5° with respect to the pixel restriction layers 141, contact angles between the inks and the pixel restrictions layers 141 become 5° or more. That is, when ink is dried to a state illustrated in FIG. 5A, then when a contact angle between ink and a pixel regulation layer is less than 5°, a loss in uniformity of film thickness, such as that illustrated in FIG. 4B, 4C, can be suppressed.

Figure 5B:
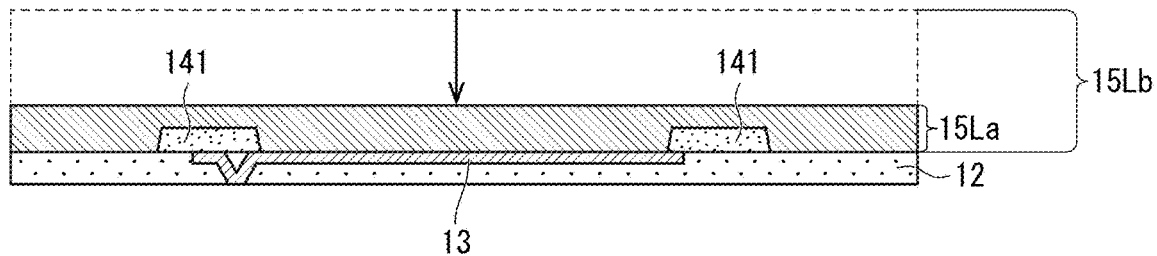
Figure 5C:
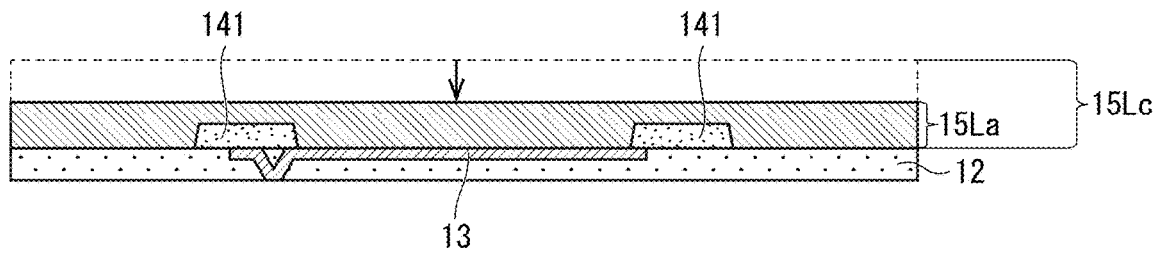

How much solvent content decreases from immediately after application of functional layer forming ink to an ink amount that can form a contact angle of 5° with respect to the pixel regulation layers 141 depends on size of the light-emission region 100a. FIG. 5B is a schematic cross-section diagram illustrating a large application amount per unit area and FIG. 5C is a schematic cross-section diagram illustrating a small application amount per unit area. More specifically, an amount of ink 15La that can form a contact angle of 5° with respect to the pixel regulation layers 141 is determined by an area of a bottom of the light-emission area 100a of the opening 14a and height of the pixel regulation layers 141 from the pixel electrodes 13. In FIG. 5B, 5C, an amount of ink that can form a contact angle of 5° on the pixel regulation layers 141 is illustrated as having a uniform liquid level. However, an amount of ink immediately after application depends on resolution of the display panel, and the higher the resolution, the greater the concentration of solute, and therefore an application amount is smaller. The higher the resolution of a panel, the shorter the distance between banks, and the smaller the width of the openings 14a in the X direction, and therefore a maximum ink application amount per unit area that would not cause ink to overflow even if exceeding tops of banks decreases, and an amount of ink that can be applied per unit area decreases. That is, in general, when resolution is not high, an amount of ink immediately after application is large, as illustrated by the amount of ink 15Lb in FIG. 5B, and when resolution is high, an amount of ink immediately after application is small, as illustrated by the amount of ink 15Lc in FIG. 5C.

Figure 6:
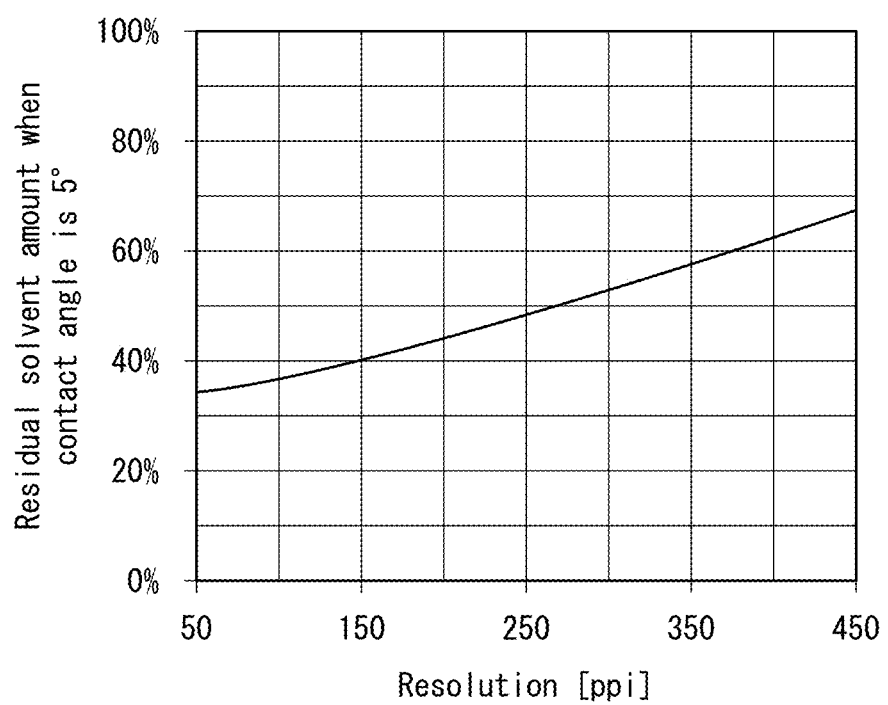
FIG. 6 is a graph illustrating a relationship between resolution of the self-luminous panel 10 and solvent residual ratio at an ink amount at which a contact angle with respect to a pixel regulation layer can be 5°.

FIG. 6 is a graph illustrating examples of resolutions of self-luminous panels vs solvent residual ratio for an amount of functional layer forming ink that can form a contact angle of 5° with respect to the pixel regulation layers 141. The solvent residual ratio is a ratio of mass of remaining solvent to mass of mixed solvent in the functional layer forming ink prior to application. As illustrated in FIG. 6, the higher the resolution, the larger the solvent residual ratio. Further, the solvent residual ratio is 30% or greater. When the solvent residual ratio is less than 30%, the amount of ink immediately after application is large, and therefore there is a risk of ink overflowing the banks. Further, for example, in a self-luminous panel having a resolution of 150 ppi, the solvent residual ratio is approximately 40% for an amount of ink that can form a contact angle of 5° with respect to the pixel regulation layers 141, and in a self-luminous panel having a resolution of 250 ppi, the solvent residual ratio is approximately 50% for an amount of ink that can form a contact angle of 5° with respect to the pixel regulation layers 141. When a resolution of a self-luminous panel is x (ppi) and a ratio of an amount of a solvent of a functional layer forming ink that can form a contact angle of 5° with respect to the pixel regulation layers 141 (solvent residual ratio) is y, the following relationship is true:

$$y \geq 0.0008x + 0.27512 \quad \text{(Formula 1)}$$

<Mixed Solvent Composition>

Table 1 shows different compositions of 4 solvents as mixed solvents in functional layer forming inks and experimental results indicating whether uniformity in film thickness of a resulting functional layer was achieved. The groups A and B are defined as described above, and a result of no significant variation in film thickness of a functional layer is indicated by a ○ (circle), while a result of variation in film thickness of a functional layer is indicated by a x (cross). Resolution of the self-luminous panel was 150 ppi, and a material of the pixel regulation layers 141 was acrylic resin. According to at least one embodiment, a boiling point of a solvent having a highest boiling point among the solvents in the mixed solvent is 200° C. or higher, and therefore no experiment was performed on a mixed solvent including on ethylene glycol and anisole.

TABLE 1

| | | Solvent | | | | |
|---|---|---|---|---|---|---|
| | | 3-Methoxyphenol | Isophorone | Ethylene glcol | Anisol | |
| | | | Solvent group | | | |
| | | Group B | Group A | Group B | Group A | |
| | | | Boiling point | | | |
| | | 232 | 215 | 197 | 154 | Results |
| Solvent ratio [wt %] | Composition 1 | 30 | | 20 | 50 | x |
| | Composition 2 | 25 | 30 | | 45 | x |
| | Composition 3 | 10 | 40 | | 50 | x |
| | Composition 4 | | 33 | 34 | 33 | x |
| | Composition 5 | | 40 | 30 | 30 | ○ |
| | Composition 6 | | 50 | 50 | | ○ |

TABLE 1-continued

| | Solvent | | | | |
|---|---|---|---|---|---|
| | 3-Methoxyphenol | Isophorone | Ethylene glcol | Anisol | |
| | | Solvent group | | | |
| | Group B | Group A | Group B | Group A | |
| | | Boiling point | | | |
| | 232 | 215 | 197 | 154 | Results |
| Composition 7 | | 50 | | 50 | ○ |
| Composition 8 | 50 | | 50 | | x |

As indicated in Table 1, variation in film thickness of the functional layers did not occur for compositions 5-7. Variation in film thickness of the functional layers did occur for compositions 1-4, and 8.

Compositions 1-3 each included 3-Methoxyphenol, which is included in group B and had the highest boiling point. Accordingly, when the ink is dried to an ink amount that can form a contact angle of 5° with respect to the pixel regulation layers 141, 3-Methoxyphenol included in group B remains in the ink as a solvent. Accordingly, the contact angle with respect to the pixel regulation layers 141 becomes 5° or more, ink on the pixel regulation layers 141 is interrupted and separates into ink islands, and therefore variation in film thickness of the functional layers occurs.

In composition 8, all solvents in the mixed solvent are included in group B, and therefore of course, when the ink is dried to an amount that can form a 5° contact angle on the pixel regulation layers 141, the contact angle on the pixel regulation layers 141 becomes 5° or more, and ink on the pixel regulation layers 141 is interrupted and separates into ink islands such that variation in film thickness of the functional layers occurs.

In composition 4, the solvent with the highest boiling point is isophorone, which is included in group A. However, the isophorone content is 33 wt %, and the solvent with the next highest boiling point is ethylene glycol, which is included in group B. That is, when solvents are selected in descending order of boiling point such that a proportion of the mixed solvent if 40% or more, ethylene glycol from group B is selected in addition to isophorone from group A. In this case, when the ink dries to an amount of ink that can form a contact angle of 5° with respect to the pixel restriction layers 141, that is, when enough solvent has evaporated that 40% of the solvent remains, ethylene glycol from group B remains in the ink. Accordingly, the contact angle with respect to the pixel regulation layers 141 becomes 5° or more, ink on the pixel regulation layers 141 is interrupted and separates into ink islands, and therefore variation in film thickness of the functional layers occurs.

On the other hand, in compositions 5-7, the solvent with the highest boiling point is isophorone, which is included in group A, at a ratio of 40 wt % or more. That is, when solvents are selected in descending order of boiling point such that a proportion of the mixed solvent if 40% or more, only isophorone from group A is selected. In this case, when the ink dries to an amount of ink that can form a contact angle of 5° with respect to the pixel restriction layers 141, that is, when enough solvent has evaporated that 40% of the solvent remains, only isophorone from group A remains in the ink, and a solvent from group B is not included. Accordingly, the contact angle with respect to the pixel regulation layers 141 does not become 5° or more, ink on the pixel regulation layers 141 is not interrupted, and therefore variation in film thickness of the functional layers does not occur.

As described above, according to at least one embodiment, the composition of the mixed solvent is such that when the ink is dried to an amount of ink that can form a contact angle of 5° on the pixel regulation layers 141, solvent included in group B does not remain in the ink. As a general rule, mixed solvent dries in order from the solvent with the lowest boiling point, and therefore according to at least one embodiment, when solvent from a mixed solvent is selected in descending order of boiling point to a solvent residual ratio or greater, where the solvent residual ratio indicates drying of the mixed solvent until an amount of ink remains that can form a contact angle of 5° with respect to pixel regulation layers 141, then solvent from group B is not included and only solvent from group A is included. In other words, according to at least one embodiment, when the solvent residual ratio (mass ratio) indicating drying of the mixed solvent until an amount of ink remains that can form a contact angle of 5° with respect to pixel regulation layers 141 is set to a defined ratio, then when solvent from the mixed solvent is selected in descending order of boiling point to the defined ratio or greater with respect to the mass ratio of the mixed solvent, then only solvent from group A is included. On the other hand, it does not matter whether unselected solvent is included in group A or group B, and may be included in group B. This is because solvent not selected does not remain in the ink when the ink is dried to an ink amount that can form a contact angle of 5° with respect to the pixel regulation layers 141. According to at least one embodiment, the solvent not selected includes solvent from group A, and according to at least one embodiment the mixed solvent is made entirely of solvents from group A.

Figure 4D:
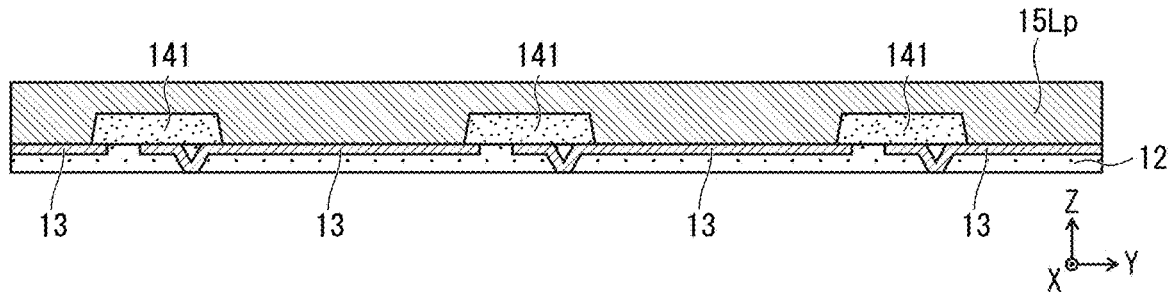
Figure 4E:
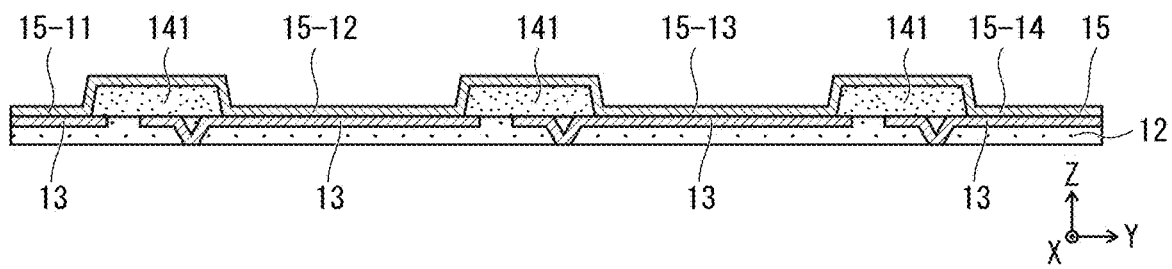

When the above conditions are satisfied, then when the ink is dried to an amount that can form a contact angle of 5° with respect to the pixel regulation layers 141, then as illustrated in FIG. 4D, ink 15Lp above the pixel restriction layers 141 in the openings 14a is not interrupted and dries across the pixel electrodes 13. Accordingly, fluidity of the ink between sub-pixels is maintained during ink drying. Accordingly, even after the ink has dried, then as illustrated in FIG. 4E, a film 15 containing functional material is formed that includes functional layers 15-11, 15-12, 15-13, 15-14, and therefore film thickness of the functional layers can be made uniform between any two adjacent sub-pixels in the Y direction.

<Solvent Group Conditions>

The following describes in more detail a difference between solvent having a contact angle of less than 5° with respect to the pixel regulation layers 141 (group A solvent) and solvent having a contact angle of 5° or more (group B solvent).

Figure 7:
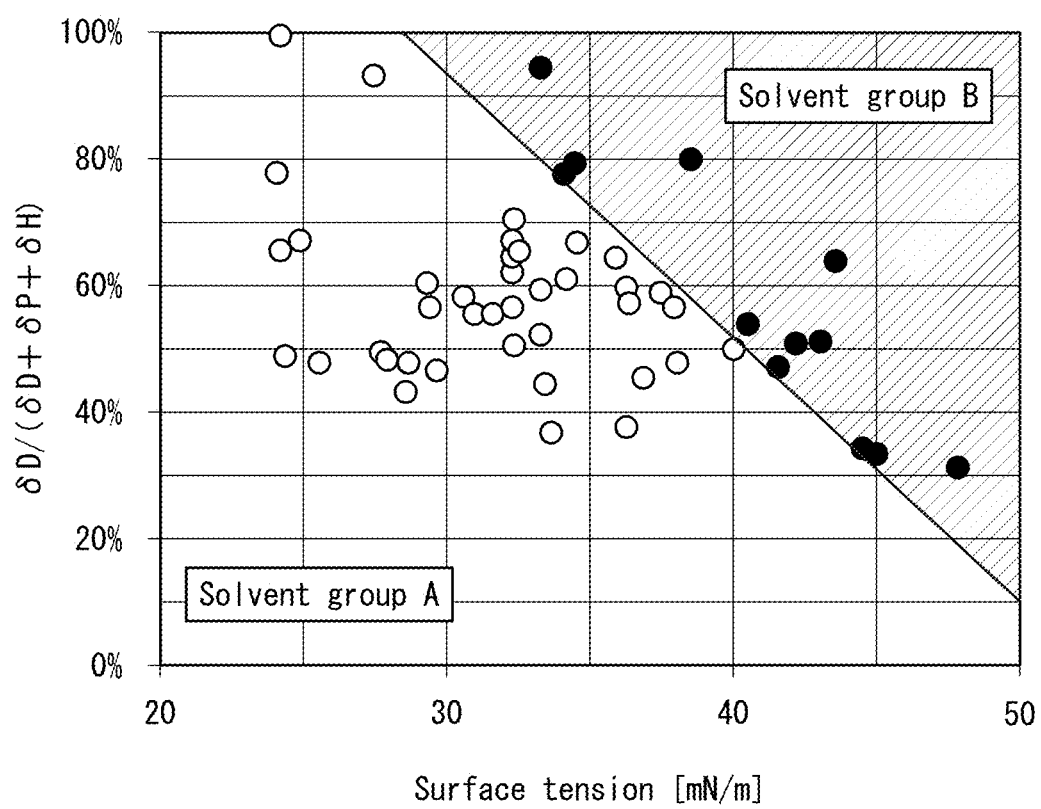
FIG. 7 is a scatter diagram illustrating plots of surface tension and values calculated from a Hansen solubility parameter, with respect to an acrylic resin pixel regulation layer, a pure solvent having a contact angle of 5° or more with respect to the pixel regulation layer, and a pure solvent having a contact angle of less than 5°.

FIG. 7 is a scatter diagram plotting values calculated from surface tension of solvent (mN/m) on a horizontal axis and Hansen solubility parameter (HSP) on a vertical axis. The value on the vertical axis is the ratio of energy due to London dispersion force (δD) to HSP, which the sum of δD, energy due to interaction between dipoles (δP), and energy due to hydrogen bonds (δH) (δD+δP+δH). In other words, the smaller the value, the stronger the dipole interaction and hydrogen bonds in polar molecules, and the larger the value, the more likely that molecules are non-polar.

Known solvents having a contact angle of less than 5° with respect to acrylic resin are shown in Table 2, below, and are plotted as solvents of group A in FIG. 7.

TABLE 2

| | δD | δP | δH | Surface tension |
|---|---|---|---|---|
| 2,5-Dimethyl-2,5-Hexadiene | 16.2 | 1.8 | 2.7 | 24.2 |
| Dodecane | 16.0 | 0.0 | 0.0 | 24.3 |
| 3,7-Dimethyl-3-Octanol | 15.9 | 2.5 | 5.8 | 24.4 |
| N,N-Diethylhydroxylamine | 15.8 | 2.2 | 14.2 | 24.5 |
| 1-Chlorohexane | 16.1 | 6.2 | 1.7 | 25.0 |
| Ethylene Glycol Monobutyl Ether | 16.0 | 5.1 | 12.3 | 25.7 |
| Mesitylene | 18.0 | 0.6 | 0.6 | 27.6 |
| 2-Nitropropane | 16.2 | 12.1 | 4.1 | 27.9 |
| Dipropylen Glycol Monobutyl Ether | 15.7 | 6.5 | 10.0 | 28.1 |
| Dipropylene Glycol Methyl Ether | 15.5 | 5.7 | 11.2 | 28.8 |
| 2-Methyl-2,4-pentanediol | 16.7 | 6.8 | 15.0 | 28.8 |
| 4-MethylCyclohexanone | 17.7 | 7.2 | 4.5 | 29.5 |
| Isophorone | 17.0 | 8.0 | 5.0 | 29.6 |
| N,N-Diethyl Acetamide | 16.4 | 11.3 | 7.5 | 29.8 |
| 2-Methyl Cyclohexanone | 17.6 | 7.8 | 4.7 | 30.7 |
| Diethyl Fumarate | 16.7 | 5.6 | 7.6 | 31.1 |
| Tetraethylene Glycol Dimethyl Ether | 15.8 | 6.0 | 6.6 | 31.7 |
| Benzyl Methyl Ether | 17.7 | 4.1 | 4.6 | 32.4 |
| Cyclohexanone | 17.8 | 8.4 | 5.1 | 32.4 |
| N,N'-Diethylaniline | 17.8 | 2.8 | 4.6 | 32.5 |
| Butyl Benzoate | 18.3 | 5.6 | 5.5 | 32.5 |
| Cyclopentanone | 17.9 | 11.9 | 5.2 | 32.5 |
| p-Methylanisole | 18.2 | 4.9 | 5.0 | 32.5 |
| Propyl Benzoate | 17.6 | 5.7 | 3.6 | 32.6 |
| Cycloheptanone | 17.2 | 10.6 | 4.8 | 33.4 |
| Ethyl Benzoate | 17.9 | 6.2 | 6.0 | 33.4 |
| 2-Methyl Pyrazine | 18.3 | 12.3 | 10.5 | 33.6 |
| Dipropylene Glycol | 16.5 | 10.6 | 17.7 | 33.8 |
| Anisole | 17.8 | 4.4 | 6.9 | 34.3 |
| Anethole | 18.5 | 4.3 | 4.8 | 34.7 |
| Propiophenone | 18.2 | 6.3 | 3.8 | 36.0 |
| Hydroxyethyl Acrylate | 16.0 | 13.2 | 13.4 | 36.4 |
| Ethyl Cinnamate | 18.4 | 8.2 | 4.1 | 36.4 |
| 4-Chloroanisole | 19.6 | 7.8 | 6.7 | 36.5 |
| Tetrahydrofurfuryl Alcohol | 17.8 | 8.2 | 12.9 | 37.0 |
| Benzyl Formate | 18.1 | 5.8 | 6.8 | 37.5 |
| Benzyl Butyl Phthalate | 19.0 | 11.2 | 3.1 | 38.1 |
| N-Methyl-2-Pyrrolidone (NMP) | 18.0 | 12.3 | 7.2 | 38.2 |
| Benzyl Alcohol | 18.4 | 6.3 | 13.7 | 38.7 |
| 1,3-dimethyl-2-imidazolidinone | 18.2 | 10.0 | 8.1 | 40.2 |

Further, known solvents having a contact angle of 5° or more with respect to acrylic resin are shown in Table 3, below, and are plotted as solvents of group B in FIG. 7.

TABLE 3

| | δD | δP | δH | Surface tension |
|---|---|---|---|---|
| Cyclo hexyl benzene | 18.7 | 0.0 | 1.0 | 33.4 |
| 2-Isopropylnaphthalene | 18.7 | 2.2 | 3.0 | 34.2 |
| Tetrahydronaphthalene | 19.6 | 2.0 | 2.9 | 34.6 |
| 1,1-Diphenylethene | 18.8 | 1.8 | 2.7 | 38.6 |

TABLE 3-continued

| | δD | δP | δH | Surface tension |
|---|---|---|---|---|
| Dimethyl Phthalate | 18.6 | 10.8 | 4.9 | 40.6 |
| Propylene Carbonate | 20.0 | 18.0 | 4.1 | 41.8 |
| Trans-Cinnamaldehyde | 19.4 | 12.4 | 6.2 | 42.3 |
| 3-Methoxyphenol | 19.1 | 6.8 | 11.2 | 43.2 |
| Ethanone, 1-(1-Naphthalenyl)- | 19.9 | 6.4 | 4.7 | 43.7 |
| Diethylene Glycol | 16.6 | 12.0 | 19.0 | 44.7 |
| Triethylene Glycol | 16.0 | 12.5 | 18.6 | 45.2 |
| Ethylene Glycol | 17.0 | 11.0 | 26.0 | 47.9 |

As illustrated in FIG. 7, group B solvents have a larger surface tension than group A solvents. On the other hand, it is presumed that the larger the value calculated from HSP, the smaller the surface tension that indicates the boundary between solvents of group B and solvents of group A. When the value of surface tension is x (mN/m) and the ratio of δD to δD+δP+δH is y, solvents of group A satisfy the following Formula 2:

$$x + 0.04 \times y < 2.12 \quad \text{(Formula 2)}$$

On the other hand, solvents of group B satisfy the following Formula 3:

$$x + 0.04 \times y \geq 2.12 \quad \text{(Formula 3)}$$

The above relationship is also considered to be the same for solvents not included in Table 2 and Table 3. That is, even if a solvent is not listed in Table 2 or Table 3, a solvent satisfying Formula 2 can be considered as a solvent of group A with respect to a pixel regulation layer composed of acrylic resin, and a solvent satisfying Formula 3 can be considered as a solvent of group B with respect to a pixel regulation layer composed of acrylic resin. Further, it is considered that the same applies when a material having similar chemical properties to acrylic resin is used as material of the pixel regulation layers.

<Self-Luminous Element Structure and Manufacture>

The following describes an example of a top-emission type of organic EL element as an example of a self-luminous element using a functional layer forming ink according to at least one embodiment, and a method of manufacturing same, with reference to the drawings. The drawings are schematic, and are not necessarily drawn to scale.

1. Organic EL Element Structure

Typically, in an organic EL display panel, one pixel is composed of three sub-pixels that emit red (R), green (G), and blue (B) light, respectively. Each sub-pixel is composed of an organic EL element that emits a corresponding color.

As described above, the organic EL elements 2 include the substrate 11, the interlayer insulating layer 12, the pixel electrodes 13, the banks 14, the hole injection layers 15, the hole transport layers 16, the light-emitting layers 17, the electron transport layer 18, the electron injection layer 19, the counter electrode 20, and the sealing layer 21. The substrate 11, the interlayer insulating layer 12, the electron transport layer 18, the electron injection layer 19, the counter electrode 20, and the sealing layer 21 are not formed per sub-pixel, and are common to a plurality of organic EL elements of an organic EL display panel.

(1) Substrate

The substrate 11 includes a base 111 that is an insulating material and a thin film transistor (TFT) layer 112. A drive circuit is formed in the TFT layer 112 for each sub-pixel. The base 111 is a glass substrate, a quartz substrate, a silicon substrate, a metal substrate such as molybdenum sulfide, copper, zinc, aluminum, stainless steel, magnesium, iron, nickel, gold, or silver, a semiconductor substrate such as gallium arsenic, a plastic substrate, or the like.

Examples of a plastic material of the plastic substrate include a thermoplastic resin and a thermosetting resin. Examples of these include polyethylene, polypropylene, polyamide, polyimide (PI), polycarbonate, acrylic resin, polyethylene terephthalate (PET), polybutylene terephthalate, polyacetal, other fluorine resins, various thermoplastic elastomers such as styrene-based, polyolefin-based, polyvinyl chloride-based, polyurethane-based, fluororubber-based, and chlorinated polyethylene-based elastomers, epoxy resin, unsaturated polyester, silicone resin, polyurethane, and the like, and copolymers, blends, polymer alloys, and the like that are mainly composed of these, and laminates of one or more of the above examples.

In order to manufacture a flexible organic EL display panel, the substrate of at least one embodiment is a plastic material.

(2) Interlayer Insulating Layer

The interlayer insulating layer 12 is formed on the substrate 11. The interlayer insulating layer 12 is made of a resin material, and has a function of planarizing unevenness of a top surface of the TFT layer 112. Examples of the resin material include a positive type of photosensitive material. Examples of the photosensitive material include acrylic resin, polyimide resin, siloxane resin, phenol resin, and the like. Further, although not illustrated in FIG. 3, contact holes are formed in the interlayer insulating layer 12 for each sub-pixel.

(3) Pixel Electrodes (First Electrode)

The pixel electrodes 13 each include a metal layer made of a light-reflective metal material, and are formed on the interlayer insulating layer 12. The pixel electrodes 13 correspond one-to-one with the sub-pixels, and are electrically connected to the TFT layer 112 via the contact holes (not illustrated).

According to at least one embodiment, the pixel electrodes 13 function as anodes.

Examples of metal materials that are light-reflective include silver (Ag), aluminum (Al), aluminum alloy, molybdenum (Mo), alloy of silver, palladium, and copper (APC), alloy of silver, rubidium, and gold (ARA), alloy of molybdenum and chromium (MoCr), alloy of molybdenum and tungsten (MoW), alloy of nickel and chromium (NiCr), and the like.

According to at least one embodiment, the pixel electrodes 13 are each a single metal layer, but according to at least one embodiment, the pixel electrodes 13 are each a laminated structure of a layer of metal oxide such as indium tin oxide (ITO) or indium zinc oxide (IZO) on a metal layer.

(4) Banks and Pixel Regulation Layers

The banks 14 partition the pixel electrodes 13 arranged above the substrate 11 into columns in the X direction (see FIG. 2), and each has a line bank shape that extends in the Y direction between sub-pixel columns CR, CG, CB. The banks 14 are electrically insulative, and at least a surface thereof is liquid repellent with respect to functional layer forming ink. According to at least one embodiment, the banks 14 are made of an electrically insulating organic material (for example, acrylic resin, polyimide resin, novolac resin, phenol resin, or the like). According to at least one embodiment, phenol resin is used. According to at least one embodiment, the banks 14 contain an additive having liquid repellency, such as a fluorine-based surfactant, and according to at least one embodiment, the banks are surface-treated. The organic EL elements are formed in the openings 14a defined between two of the banks 14 adjacent to each other in the X direction.

The pixel regulation layers 141 partition the pixel electrodes 13 in the Y direction in the openings 14a, and have roles such as suppressing interruption of the light-emitting layers 17 in the sub-pixel columns CR, CG, CB, improving electrical insulation between the pixel electrodes 13 and the counter electrode 20, and the like. The pixel regulation layers 141 are electrically insulative, and as described above are lyophilic with respect to functional layer forming ink. According to at least one embodiment, the pixel regulation layers 141 are made of an electrically insulating organic material, and according to at least one embodiment, the pixel regulation layers 141 are made of acrylic resin.

(5) Hole Injection Layers

The hole injection layers 15 are provided on the pixel electrodes 13 to facilitate injection of holes from the pixel electrodes 13 to the light-emitting layers 17. According to at least one embodiment, each of the hole injection layers 15 is a layer made of an oxide of a metal such as silver (Ag), molybdenum (Mo), chromium (Cr), vanadium (V), tungsten (W), nickel (Ni), iridium (Ir), or the like, a low molecular weight organic compound such as copper phthalocyanine (CuPc), or a polymer material such as polyethylene dioxythiophene/polystyrene sulfonate (PEDOT/PSS).

According to at least one embodiment, the hole injection layers 15 are formed by application of the functional layer forming ink according to at least one embodiment.

(6) Hole Transport Layers

The hole transport layers 16 have a function of transporting holes injected from the hole injection layers 15 to the light-emitting layers 17. Examples of a material of the hole transport layers 16 include an arylamine derivative, a fluorene derivative, a spiro derivative, a carbazole derivative, a pyridine derivative, a pyrazine derivative, a pyrimidine derivative, a triazine derivative, a quinoline derivative, a phenanthroline derivative, a phthalocyanine derivative, a porphyrin derivative, a silole derivative, an oligothiophene derivative, a condensed polycyclic aromatic derivative, and a metal complex. According to at least one embodiment, the hole transport layers 16 are formed by application of the functional layer forming ink according to at least one embodiment.

(7) Light-Emitting Layers

The light-emitting layers 17 are formed in the openings 14a, and have a function of emitting R, G, or B colored light via recombination of holes and electrons. Known materials can be used as materials of the light-emitting layers 17.

When the self-luminous elements 2 are organic EL elements, examples of organic light-emitting material included in the light-emitting layers 17 include fluorescent substances such as an oxinoid compound, a perylene compound, a coumarin compound, an azacoumarin compound, an oxazole compound, an oxadiazole compound, a perinone compound, a pyrrolo-pyrrole compound, a naphthalene compound, an anthracene compound, a fluorene compound, a fluoranthene compound, a tetracene compound, a pyrene compound, a coronene compound, a quinolone compound and an azaquinolone compound, a pyrazoline derivative and a pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylene-pyran compound, a dicyanomethylene-thiopyran compound, a fluorescein compound, a pyrylium compound, a thiapyrylium compound, a selenapyrylium compound, a telluropyrylium compound, an aromatic alkadiene compound, an oligophenylene compound, a thioxanthene compound, a cyanine compound, an acridine compound, a metal complex of an 8-hydroxyquinoline compound, a metal complex of a 2-bipyridine compound, a complex of Schiff salts and Group III metals, an oxine metal complex, and a rare earth complex. According to at least one embodiment, a known phosphorescent substance such as a phosphorescent metal complex such as tris(2-phenylpyridine)iridium is used. Further, according to at least one embodiment, the light-emitting layers 17 include a high molecular weight compound such as polyfluorene, a polyfluorene derivative, polyphenylene, or a polyphenylene derivative, or a mixture of a low molecular weight compound and a high molecular weight compound. According to at least one embodiment, the self-luminous elements 2 are quantum dot light-emitting diodes (QLED), and a material of the light-emitting layers 17 is a material that has a quantum dot effect.

According to at least one embodiment, the light-emitting layers 17 are formed by application of the functional layer forming ink according to at least one embodiment.

(8) Electron Transport Layer

The electron transport layer 18 has a function of transporting electrons from the counter electrode 20 to the light-emitting layers 17. The electron transport layer 18 is made of an organic material having high electron transportability.

An example of the organic material of the electron transport layer 18 is a π electron low molecular weight organic material such as an oxadiazole derivative (OXD), a triazole derivative (TAZ), a phenanthroline derivative (BCP, Bphen), or the like.

(9) Electron Injection Layer

The electron injection layer 19 is provided on the electron transport layer 18, is common to a plurality of pixels, and has a function of promoting injection of electrons from the counter electrode 20 to the light-emitting layers 17.

According to at least one embodiment, the electron injection layer 19 is made of an organic material having electron transportability, doped with a metal material for improved electron injection. Here, doping means that metal atoms or metal ions of the metal material are dispersed substantially evenly in the organic material, forming a single phase containing the organic material and a trace amount of the metal material. According to at least one embodiment, no other phase is present, in particular no phase composed of only the metal material such as a metal piece or metal film, and no other phase with the metal material as a main component. Further, according to at least one embodiment, in the single phase containing the organic material and a trace amount of the metal material, the concentration of metal atoms or metal ions is uniform, and the metal atoms or metal ions are not aggregated. According to at least one embodiment, the metal material is selected from alkali metals, alkaline earth metals, or rare earth metals, and according to at least one embodiment, the metal material is Ba, Li, or Yb. According to at least one embodiment, the metal material is Ba. According to at least one embodiment, an amount of the metal material dopant in the hole injection layer 19 is from 5 wt % to 40 wt %. According to at least one embodiment, the amount is 20 wt %. An example of the organic material that has electron transportability is a π electron low molecular weight organic material such as an oxadiazole derivative (OXD), a triazole derivative (TAZ), a phenanthroline derivative (BCP, Bphen), or the like.

According to at least one embodiment, the electron injection layer 19 includes a layer nearest the light-emitting layers 17 that includes a metal fluoride selected from alkali metals or alkaline earth metals, or includes a quinolinium complex of a metal selected from alkali metals or alkaline earth metals.

According to at least one embodiment, the electron injection layer 19 is formed by film-forming by a co-evaporation method depositing a material such as an oxadiazole derivative, a triazole derivative, a phenanthroline derivative, or the like, and a metal material.

(10) Counter Electrode

The counter electrode 20 is common to a plurality of pixels, is formed on the electron injection layer 19, and functions as a cathode.

According to at least one embodiment, the counter electrode 20 is both light-transmissive and electrically conductive, and includes at least one of a metal layer made from a metal material and a metal oxide layer made from a metal oxide. Film thickness of the metal layer is from 1 nm to 50 nm in order to be light-transmissive. Examples of a material of the metal layer include Ag, an alloy mainly composed of Ag, Al, and an alloy mainly composed of Al. Examples of Ag alloys include magnesium silver alloy (MgAg) and indium silver alloy. Ag has a low resistivity, and Ag alloy is preferable in that it has excellent heat resistance and corrosion resistance, and can maintain good electrical conductivity over a long period of time. Examples of Al alloys include magnesium-aluminum alloy (MgAl) and lithium aluminum alloy (LiAl). Examples of other alloys include lithium-magnesium alloy and lithium-indium alloy. Examples of a material of the metal oxide layer include ITO and IZO.

According to at least one embodiment, the counter electrode 20 is composed of only the metal layer or only the metal oxide layer, but according to at least one embodiment, the counter electrode 20 has a laminated structure in which the metal oxide layer is on the metal layer, or the metal layer is on the metal oxide layer.

(11) Sealing Layer

The sealing layer 21 is provided on the counter electrode 20. The sealing layer 21 has a function of preventing entry of impurities (water, oxygen) into the counter electrode 20, the electron injection layer 19, the electron transport layer 18, the light-emitting layers 17, and the like from a side of the display panel opposite the substrate 11, and thereby suppressing deterioration of these layers due to the impurities. Examples of a light-transmissive material used in the sealing layer 21 include silicon nitride (SiN) and silicon oxynitride (SiON). Further, according to at least one embodiment, a sealing resin layer made of a resin material such as acrylic resin, epoxy resin, or the like is provided on the layer made using silicon nitride (SiN), silicon oxynitride (SiON), or the like.

According to at least one embodiment, the organic EL display panel 10 is a top-emission type, and therefore the sealing layer 21 is made of a light-transmissive material.

(12) Other Structure

Although not illustrated in FIG. 3, according to at least one embodiment, a color filter or deflection sheet based on a glass substrate is attached onto the sealing layer 21 via an adhesive. Such attachment further protects the hole transport layers 16, the light-emitting layers 17, the electron transport layer 18, and the electron injection layer 19 from moisture and air.

2. Organic EL Element Manufacture

The following describes a method of manufacturing the organic EL elements 2, with reference to the drawings.

Figure 8:
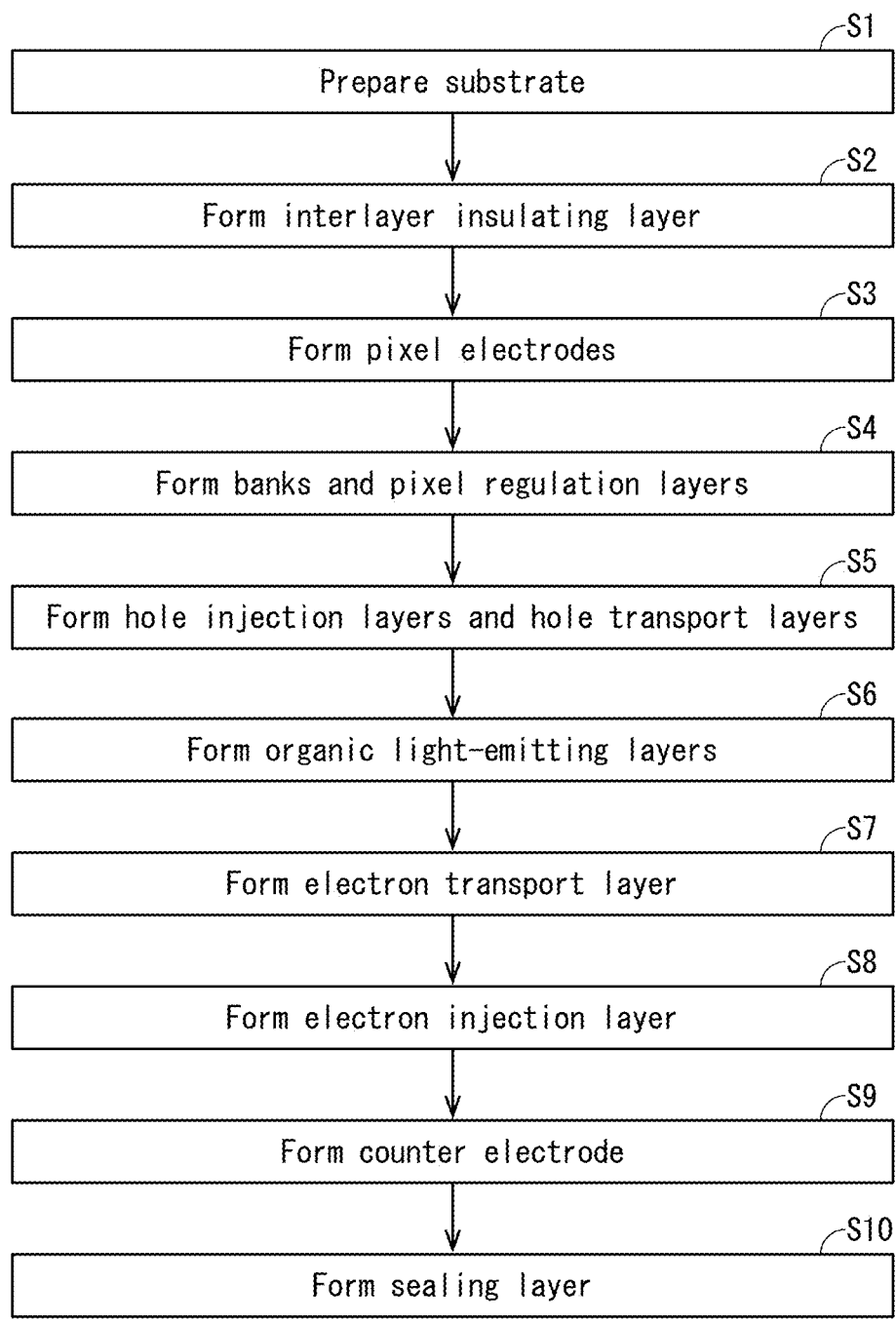
FIG. 8 is a flowchart illustrating manufacture of a self-luminous element according to at least one embodiment.

FIG. 8 is a flowchart illustrating a method of manufacturing the organic EL display panel 10 that includes the organic EL elements 2. FIG. 9A to FIG. 12D are each schematic cross-section diagrams illustrating steps in manufacture of the organic EL display panel 10, corresponding to the line A-A in FIG. 2.

(1) Forming Substrate 11

Figure 9A:
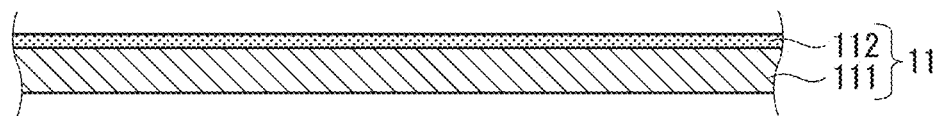
FIG. 9A, 9B, 9C, 9D are cross-section diagrams schematically illustrating steps in manufacturing the self-luminous element according to at least one embodiment, where

First, the substrate 11 is formed by forming the TFT layer 112 on the base 111 (step S1 in FIG. 8; FIG. 9A). The TFT layer 112 can be formed by a known method for manufacturing TFTs.

Figure 9B:
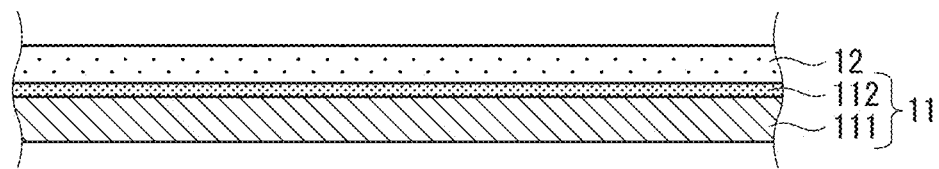

Next, the interlayer insulating layer 12 is formed on the substrate 11 (step S2 in FIG. 8; FIG. 9B).

Specifically, a resin material having a constant fluidity is applied by a die coating method, for example, so as to fill in unevenness on the substrate 11 due to the TFT layer 112 across an upper surface of the substrate 11. As a result, a top surface of the interlayer insulating layer 12 is flat, parallel to a top surface of the base 111.

Next, a dry etching method is performed on the interlayer insulating layer 12 at locations on source electrodes of TFT elements, for example, to form contact holes. The contact holes are formed using patterning or the like such that bottoms of the contact holes expose top surfaces of the source electrodes.

Subsequently, connecting electrode layers are formed along inner walls of the contact holes. A portion of each of the connecting electrodes is disposed on the interlayer insulating layer 12. The connecting electrode layers are formed by using a sputtering method, for example, and after metal film formation, patterning is performed using a photolithography method and a wet etching method.

(2) Forming Pixel Electrodes 13

Next, the pixel electrodes 13 are formed on the interlayer insulating layer 12 (step S3 in FIG. 8)

Figure 9C:
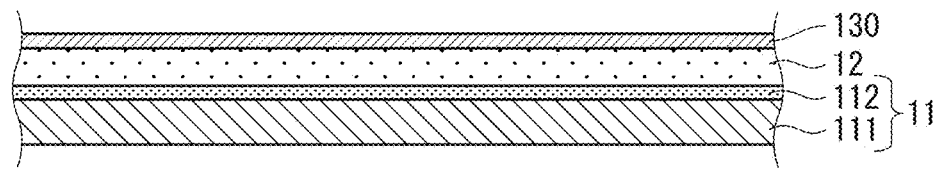
Figure 9D:
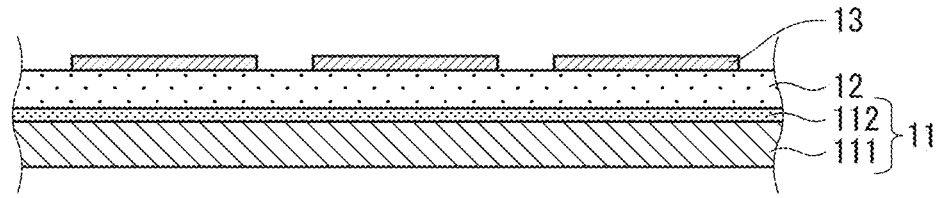

First, a pixel electrode material layer 130 made of material of the pixel electrodes 13 is formed on the interlayer insulating layer 12 by a method such as vacuum deposition, sputtering, or the like (FIG. 9C). Next, the pixel electrode material layer 130 is patterned by etching to form the pixel electrodes 13 separated into sub-pixels (FIG. 9D).

(3) Forming Pixel Regulation Layers 141 and Banks 14

Next, the pixel regulation layers 141 and the banks 14 are formed (step S4 in FIG. 8).

Figure 10A:
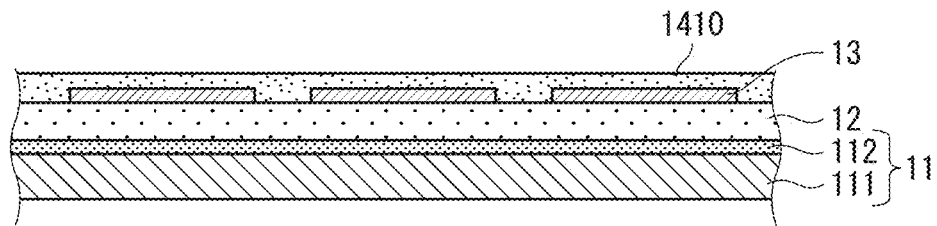
FIG. 10A, 10B, 10C, 10D are cross-section diagrams schematically illustrating steps in manufacturing the self-luminous element according to at least one embodiment, where
Figure 10B:
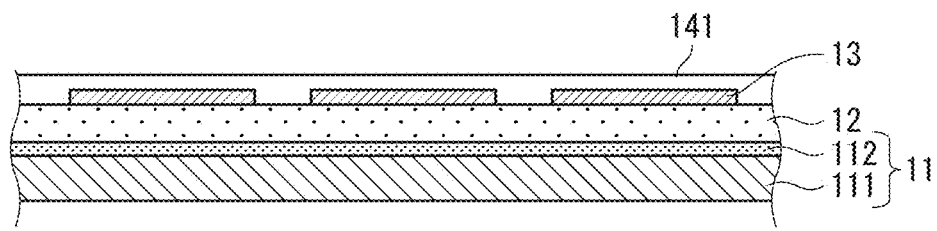
Figure 10C:
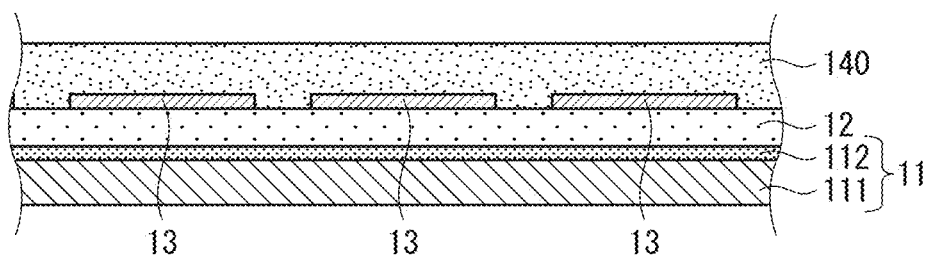
Figure 10D:
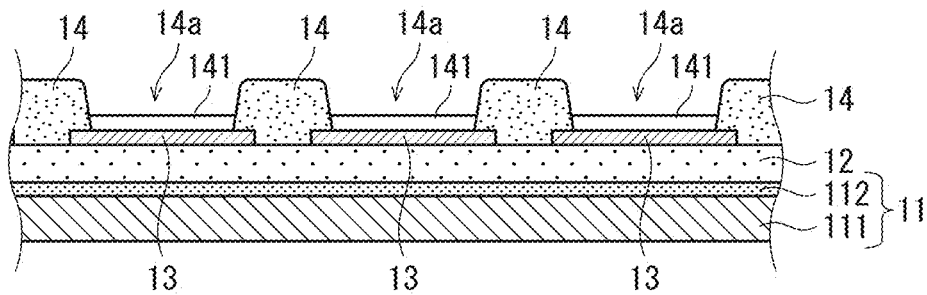

First, a solution in which acrylic resin, which is a pixel regulation layer resin, is dissolved in a solvent is uniformly applied onto the pixel electrodes 13 and the interlayer insulating layer 12 by a spin coating method or the like to form a pixel regulation material layer 1410 (FIG. 10A). Next, the pixel regulation material layer 1410 is patterned by light exposure and development to form the pixel regulation layers 141 (FIG. 10B). Next, a solution in which phenol resin, which is a resin of the banks 14, is dissolved in a solvent (for example, a mixed solvent of ethyl lactate and γ-Butyrolactone (GBL)) is uniformly applied onto the pixel electrodes 13, the pixel regulation layers 141, and the interlayer insulating layer 12 by a spin coating method or the like to form a bank material layer 140 (FIG. 10C). Next, the bank material layer 140 is patterned by light exposure and development to form the banks 14 (FIG. 10D).

(4) Forming Hole Injection Layers 15 and Hole Transport Layers 16

Figure 11A:
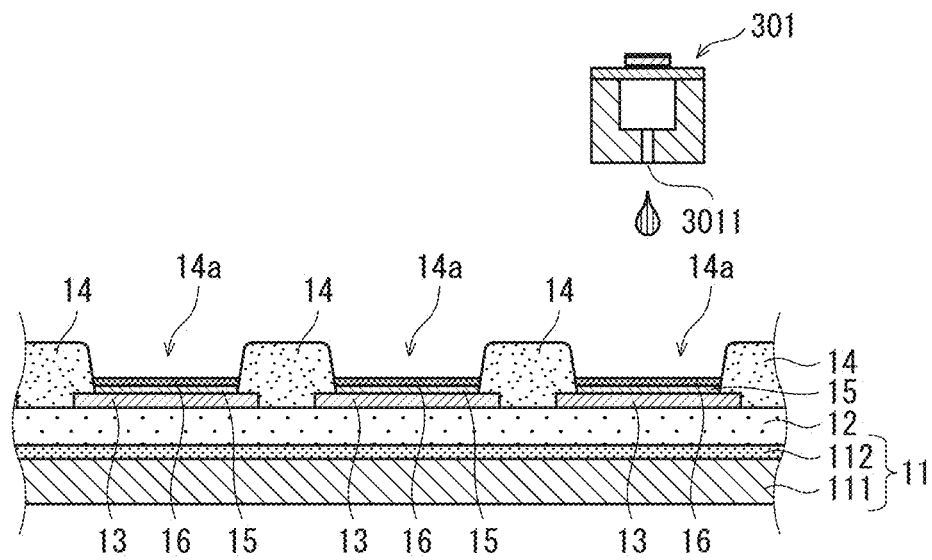
FIG. 11A, 11B are cross-section diagrams schematically illustrating steps in manufacturing the self-luminous element according to at least one embodiment, where

Next, the hole injection layers 15 and the hole transport layers 16 are formed (step S5 in FIG. 8; FIG. 11A).

First, a hole injection layer forming ink containing material of the hole injection layers 15 as a solute is ejected from nozzles 3011 of a printing device 301 into the openings 14a defined by the banks 14 to be applied onto the pixel electrodes 13 in the openings 14a, then dried to form the hole injection layers 15. Next, a hole transport layer forming ink containing material of the hole transport layers 16 as a solute is ejected from the nozzles 3011 of the printing device 301 into the openings 14a defined by the banks 14 to be applied onto the hole injection layers 15 in the openings 14a, then dried to form the hole transport layers 16.

(5) Forming Light-Emitting Layers 17

Figure 11B:
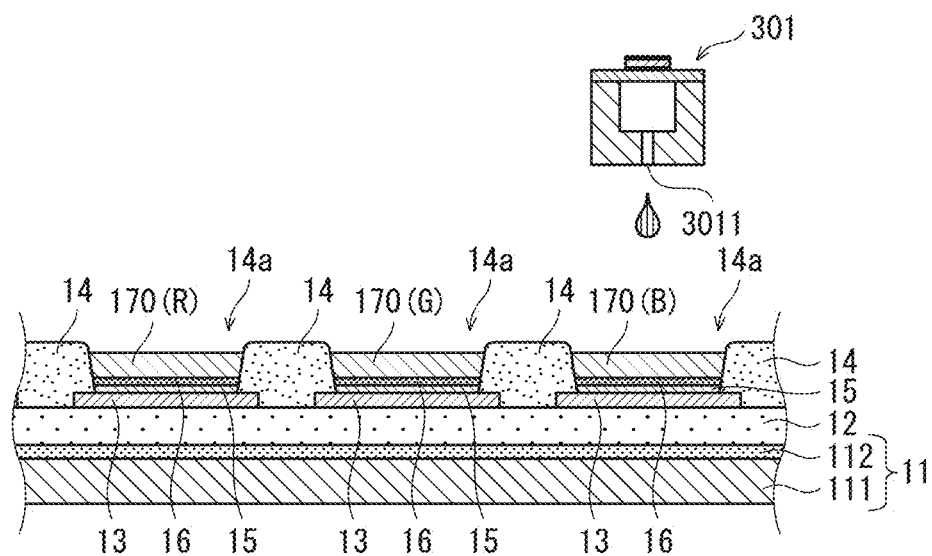

Next, light-emitting layer forming inks containing materials of the light-emitting layers 17 as solutes are ejected from the nozzles 3011 of the printing device 301 into the openings 14a defined by the banks 14 to be applied onto the hole transport layers 16 in the openings 14a, then dried to form the light-emitting layers 17 (step S6 in FIG. 8; FIG. 11B).

(6) Forming Electron Transport Layer 18

Figure 12A:
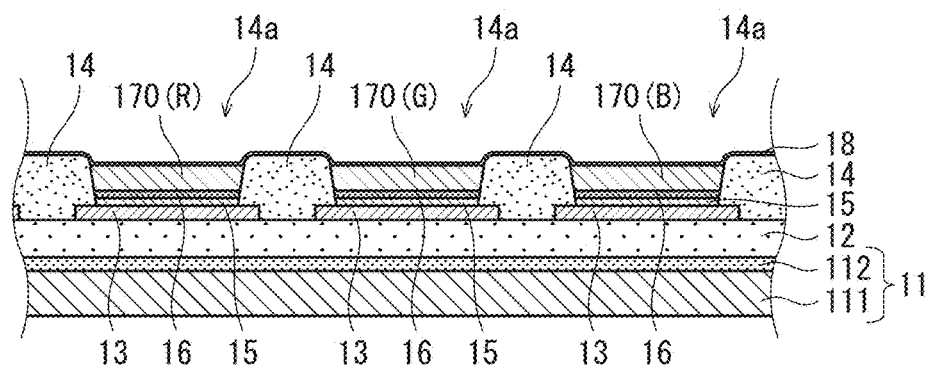
FIG. 12A, 12B, 12C, 12D are cross-section diagrams schematically illustrating steps in manufacturing the self-luminous element according to at least one embodiment, where

Next, the electron transport layer 18 is formed on the light-emitting layers 17 and the banks 14 (step S7 in FIG. 8; FIG. 12A). The electron transport layer 18 is formed, for example, by using a vacuum deposition method to deposit a film of an electron-transporting organic material across all sub-pixels.

(7) Forming Electron Injection Layer 19

Figure 12B:
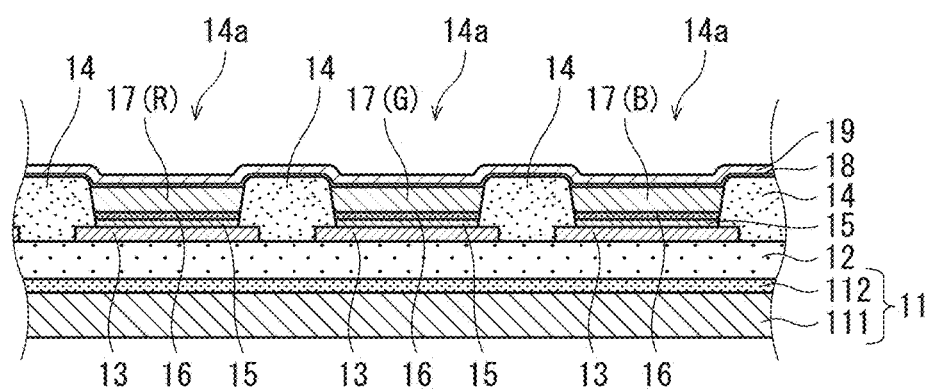

Next, the electron injection layer 19 is formed on the electron transport layer 18 (step S8 in FIG. 8; FIG. 12B). The electron injection layer 19 is formed, for example, by using a co-deposition method to deposit a film of an electron-transporting organic material and a dopant metal across all sub-pixels.

(8) Forming Counter Electrode 20

Figure 12C:
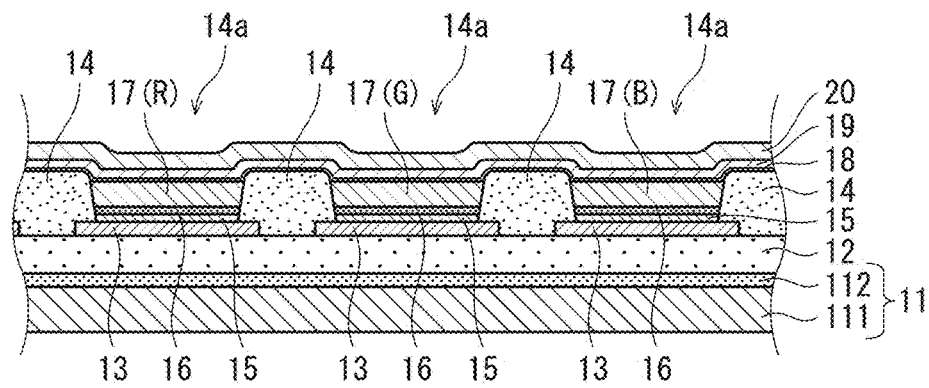

Next, the counter electrode 20 is formed on the electron injection layer 19 (step S9 in FIG. 8; FIG. 12C). The counter electrode 20 is formed by using a sputtering method or vacuum deposition method to deposit a film of a material such as ITO, IZO, Ag, Al, or the like.

(9) Forming Sealing Layer 21

Figure 12D:
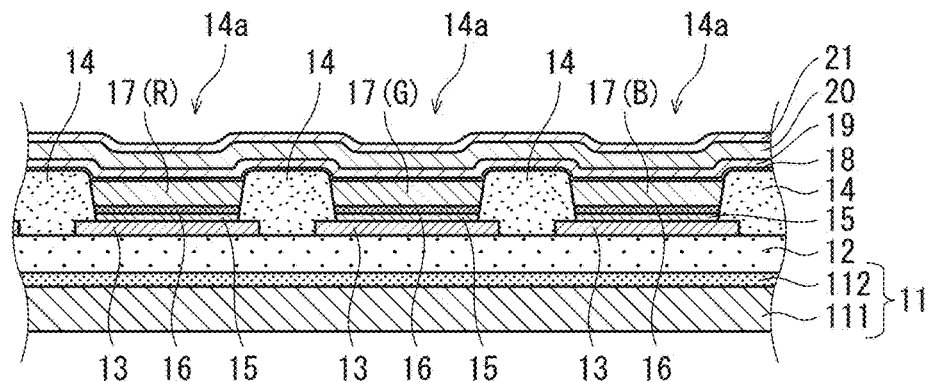

Next, the sealing layer 21 is formed on the counter electrode 20 (step S10 in FIG. 8; FIG. 12D). The sealing layer 21 can be formed by applying SiON, SiN, or the like by a sputtering method, a chemical vapor deposition method, or the like.

This completes the organic EL elements 2.

<<Modifications>>

Compositions of light-emitting layer forming inks of organic EL elements and methods manufacturing organic EL elements using said inks have been described as embodiments of the present disclosure, but the present disclosure is not limited to this description except where essential characteristic elements are described. The following describes modifications as further embodiments of the present disclosure.

(1) According to at least one embodiment, the pixel electrodes are anodes, the counter electrode is a cathode, and the organic EL elements are top-emission elements. However, according to at least one embodiment, the pixel electrodes are cathodes and the counter electrode is an anode. Further, the organic EL elements are bottom-emission elements. In this case, the pixel electrodes are made of a light-transmissive electrically-conductive material and the counter electrode is made of a light-reflecting electrically-conductive material. Further, at least a portion of the substrate under the pixel electrodes is light-transmissive.

Self-luminous elements are not limited to being organic EL elements, and according to at least one embodiment are QLEDs or other elements.

(2) According to at least one embodiment, the hole injection layers 15, the hole transport layers 16, and the light-emitting layers 17 are formed by application of functional layer forming inks according to at least one embodiment. However, according to at least one embodiment, it suffices that at least one functional layer is formed by application of a functional layer forming ink according to at least one embodiment. For example, the hole injection layers 15 are formed by sputtering, or the hole transport layers 16 are formed by vacuum deposition. According to at least one embodiment, the electron transport layer 18, the electron injection layer 19, or both the electron transport layer 18 and the electron injection layer 19 are formed by application of functional layer forming ink according to at least one embodiment.

(3) According to at least one embodiment, the organic EL elements 2 each have a structure including the electron transport layer 18, the electron injection layer 19, the hole injection layers 15 and the hole transport layers 16, but the organic EL elements 2 are not limited to this structure. According to at least one embodiment, the organic EL elements do not include the electron transport layer 18, or do not include the hole transport layers 16. Further, according to at least one embodiment, hole injection transport layers are provided instead of the hole injection layers 15 and the hole transport layers 16. Further, according to at least one embodiment, an intermediate layer made of an alkali metal, an alkaline earth metal, a rare earth metal, or a fluoride thereof is disposed between the light-emitting layers 17 and the electron transport layer 18.

(4) According to at least one embodiment, the functional layer forming ink is a solution containing a functional material as a solute, but the ink is not limited to this example. According to at least one embodiment, the ink is a colloidal solution or suspension in which the functional material is dispersed in a mixed solvent.

(5) As long as can be applied via nozzles with high definition, the present disclosure is not limited to an inkjet device. According to at least one embodiment, a dispenser-type application device that continuously ejects ink onto the substrate is used.

(6) According to at least one embodiment, the self-luminous elements are partitioned by a line bank scheme in which columns of banks are formed, but the present disclosure is not limited to this example. It suffices that at least one functional layer is formed by an application method, and multiple sub-pixels are present in an application area defined by banks, and therefore, according to at least one embodiment, a pixel bank structure is used in which sets of multiple sub-pixels are surrounded by banks, or a honeycomb structure is used in which hexagonal sub-pixels are arranged in a staggered pattern and banks extend in a broken-line.

Although the technology pertaining to the present disclosure has been fully described by way of examples with reference to the accompanying drawings, it is to be noted that various changes and modifications will be apparent to those skilled in the art. Therefore unless such changes and modifications depart from the scope of the present disclosure, they should be construed as being included therein.

The invention claimed is:

1. An ink used in forming a functional layer of a self-luminous element by a printing method, the ink comprising:
    functional material dissolved or dispersed in a mixed solvent including solvents having different boiling points, wherein
    when one or more solvents are selected from the solvents of the mixed solvent in descending order of boiling point until a mass ratio of the selection to the mixed solvent is a defined ratio or more, the one or more solvents in the selection are included in a solvent group of solvents that have a contact angle of less than 5° with respect to a defined resin material.

2. The ink of claim 1, wherein
    the defined resin material is acrylic resin.

3. The ink of claim 2, wherein
    the solvents in the solvent group are polar solvents.

4. The ink of claim 2, wherein
    the solvents in the solvent group each satisfy:

$$x+0.04y<2.12$$

where x is $\delta D/(\delta D+\delta P+\delta H)$, y is surface tension of the solvent in mN/m, and $\delta D$ is energy due to London dispersion force, $\delta P$ is energy due to dipole interaction, and $\delta H$ is energy due to hydrogen bonding, as defined by the Hansen solubility parameter.

5. The ink of claim 1, wherein
    the defined ratio is 0.3 or greater.

6. The ink of claim 1, wherein $$q \geq 0.00086p+0.27512$$

where p is resolution in ppi of the self-luminous element in a display and q is the defined ratio.

7. The ink of claim 1, wherein
    the mixed solvent includes solvents that have a boiling point of 200° C. or more.

8. A method of manufacturing a self-luminous element comprising:
    preparing a substrate;
    disposing pixel electrodes in a matrix of rows and columns above the substrate;
    forming pixel regulation layers that partition the pixel electrodes in a column direction;
    forming banks that partition the pixel electrodes in a row direction;
    forming functional layers above the pixel electrodes; and
    forming a counter electrode above the functional layers, wherein
    the forming of the functional layers includes application of functional layer forming ink onto the pixel electrodes in gaps between the banks and drying the functional layer forming ink after application, and
    the functional layer forming ink includes functional material dissolved or dispersed in a mixed solvent including solvents having different boiling points, and
    when one or more solvents are selected from the solvents of the mixed solvent in descending order of boiling point until a mass ratio of the selection to the mixed solvent is a defined ratio or more the one or more solvents in the selection are included in a solvent group of solvents that have a contact angle of less than 5° with respect to the pixel regulation layers.

9. The method of claim 8, wherein
    in the forming of the pixel regulation layers, acrylic resin is used as a material of the pixel regulation layers.

10. The method of claim 9, wherein the solvents in the solvent group are polar solvents.

11. The method of claim 9, wherein the solvents in the solvent group each satisfy:

$$x+0.04y<2.12$$

where x is $\delta D/(\delta D+\delta P+\delta H)$, y is surface tension of the solvent in mN/m, and $\delta D$ is energy due to London dispersion force, $\delta P$ is energy due to dipole interaction, and $\delta H$ is energy due to hydrogen bonding, as defined by the Hansen solubility parameter.

12. The ink of claim 1, wherein the contact angle is relative to a surface of the defined resin material, the defined resin material forming one or more pixel regulation layers.

* * * * *